United States Patent
Liu et al.

(10) Patent No.: US 11,017,194 B2
(45) Date of Patent: May 25, 2021

(54) IMAGE SENSING APPARATUS

(71) Applicant: Novatek Microelectronics Corp., Hsinchu (TW)

(72) Inventors: Han-Cheng Liu, New Taipei (TW); Chang-Jung Hsieh, Hsinchu (TW); Shao-Yang Chiang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 96 days.

(21) Appl. No.: 16/178,615

(22) Filed: Nov. 2, 2018

(65) Prior Publication Data

US 2019/0130154 A1    May 2, 2019

Related U.S. Application Data

(60) Provisional application No. 62/581,000, filed on Nov. 2, 2017.

(51) Int. Cl.
*G01S 15/89* (2006.01)
*G06K 9/00* (2006.01)
*H01L 27/146* (2006.01)

(52) U.S. Cl.
CPC ............ *G06K 9/0002* (2013.01); *G01S 15/89* (2013.01); *G06K 9/00067* (2013.01); *H01L 27/14609* (2013.01); *H01L 27/14603* (2013.01)

(58) Field of Classification Search
CPC .. G01S 15/89; G01R 27/2605; G06K 9/0002; G06K 9/00067; H01L 27/14609; H01L 27/14603
USPC ........................................................ 324/663
See application file for complete search history.

(56) References Cited

U.S. PATENT DOCUMENTS

| | | | |
|---|---|---|---|
| 9,367,173 B2 | 6/2016 | Setlak | |
| 9,383,876 B2 | 7/2016 | Riedijk et al. | |
| 9,672,401 B2 | 6/2017 | Riedijk et al. | |
| 10,540,041 B2 | 1/2020 | Kim et al. | |
| 2011/0242050 A1 | 10/2011 | Byun et al. | |
| 2013/0181949 A1 | 7/2013 | Setlak | |
| 2013/0314105 A1* | 11/2013 | Setlak | G01R 27/2605 324/663 |
| 2015/0015537 A1 | 1/2015 | Riedijk et al. | |
| 2016/0277696 A1 | 9/2016 | Jung et al. | |

(Continued)

FOREIGN PATENT DOCUMENTS

| | | |
|---|---|---|
| CN | 102214051 | 10/2011 |
| CN | 102375625 | 3/2012 |

(Continued)

OTHER PUBLICATIONS

"Office Action of China Counterpart Application", dated May 7, 2020, p. 1-p. 9.

*Primary Examiner* — Abdul-Samad A Aderiran
(74) *Attorney, Agent, or Firm* — JCIPRNET (57) ABSTRACT

An mage sensing apparatus includes a substrate, a sensor array and a first electrode structure. The sensor array has a plurality of sensing cells and is disposed on the substrate. The first electrode structure is disposed on the substrate, and is adjacent to a first side of the sensor array and extending along the first side of the sensor array. wherein, the first electrode structure is configured to receive a first compensation signal when a sensing operation is operating on a first plurality of sensing cells among the sensing cells of the sensor array.

12 Claims, 6 Drawing Sheets

(56) References Cited

U.S. PATENT DOCUMENTS

2016/0283771 A1  9/2016  Riedijk et al.
2017/0090028 A1* 3/2017  Djordjev ................ G01S 15/89
2017/0212636 A1  7/2017  Kim et al.

FOREIGN PATENT DOCUMENTS

| CN | 105378755 | 3/2016 |
| CN | 107025020 | 8/2017 |
| TW | 201337783 | 9/2013 |
| TW | 201428644 | 7/2014 |

\* cited by examiner

IMAGE SENSING APPARATUS

CROSS-REFERENCE TO RELATED APPLICATION

This application claims the priority benefit of U.S. provisional application Ser. No. 62/581,000, filed on Nov. 2, 2017. The entirety of the above-mentioned patent application is hereby incorporated by reference herein and made a part of this specification.

BACKGROUND OF THE INVENTION

1. Field of the Invention

The disclosure generally relates to an image sensing apparatus, and more specifically to the image sensing apparatus for sensing a fingerprint image.

2. Description of Related Art

Figure 1:
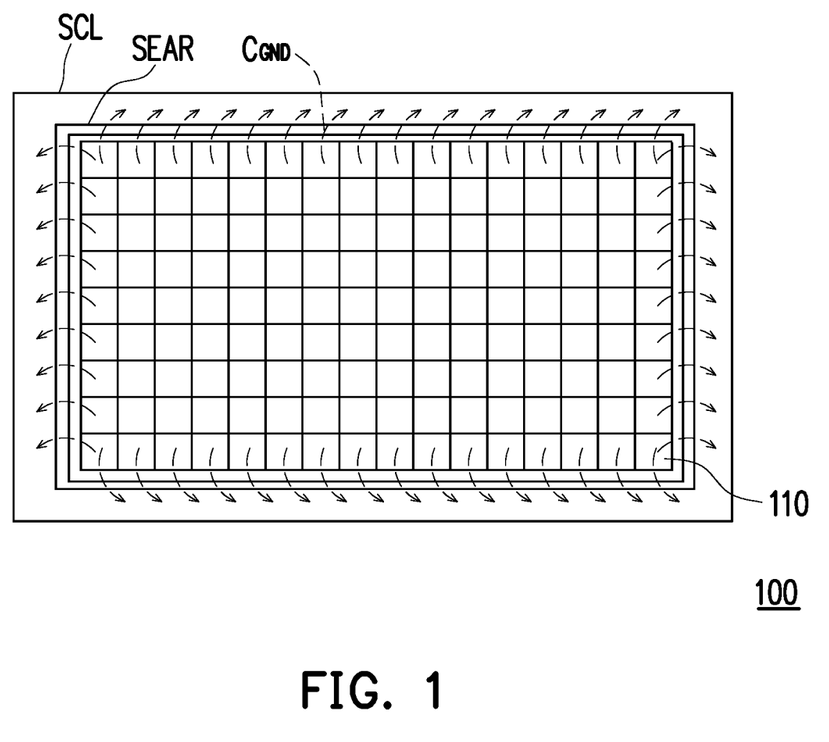
FIG. 1 illustrates an image sensing apparatus of conventional art.

Please refer to FIG. 1, which illustrates an image sensing apparatus of conventional art. The image sensing apparatus 100 is an integrated circuit (IC), and includes a sensor array 110 which is disposed on a substrate. The sensor array 110 is enclosed by a sealing SEAR and a scribe line SCL. Based on the substrate of the image sensing apparatus 100 is coupled to a reference voltage (i.e. a ground voltage), there is a parasitic capacitor $C_{GND}$ formed between an edge of the sensor array 110 and the sealing SEAR and the scribe line SCL. Based on the parasitic capacitor $C_{GND}$, luminance of the edge of a sensing image sensed by the image sensing apparatus 100 maybe lower and a quality of the sensing image is reduced.

Figure 2:
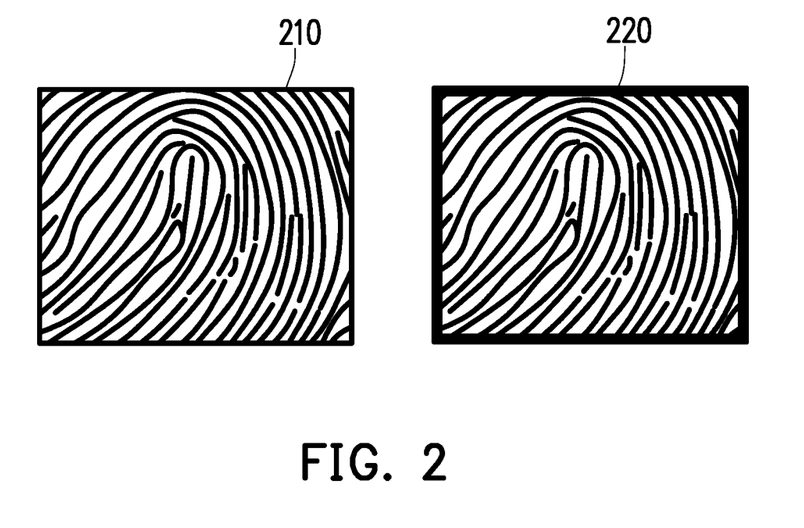
FIG. 2 illustrates an ideal sensing image and an actual sensing image.

Please refer to FIGS. 2A and 2B, which respectively illustrate an ideal sensing image and an actual sensing image. Comparing to an ideal sensing image 210 and an actual sensing image 220, there is an unwanted black ring on the edges of the actual sensing image 220, and resolution of the actual sensing image 220 is reduced.

SUMMARY OF THE INVENTION

The invention provides an image sensing apparatus for reducing an effect of parasitic capacitor on edges of a sensing image.

The image sensing apparatus includes a substrate, a sensor array and a first electrode structure. The sensor array has a plurality of sensing cells and is disposed on the substrate. The first electrode structure is disposed on the substrate, and is adjacent to a first side of the sensor array and extending along the first side of the sensor array. wherein, the first electrode structure is configured to receive a first compensation signal when a sensing operation is operating on a first plurality of sensing cells among the sensing cells of the sensor array.

In an exemplary embodiment of the disclosure, wherein the first electrode structure is separated from the first side of the sensor array by an insulating structure.

In an exemplary embodiment of the disclosure, wherein the first electrode structure is disposed between the insulating structure and a seal ring structure of the image sensing apparatus.

In an exemplary embodiment of the disclosure, wherein the first plurality of sensing cells are disposed close to the first side of the sensor array.

In an exemplary embodiment of the disclosure, the image sensing apparatus further includes a plurality of charge amplifiers, and the charge amplifiers respectively coupled to the sensing cells of the sensor array.

In an exemplary embodiment of the disclosure, wherein a phase of the first compensation signal is the same as a phase of a driving signal which is coupled to a non-inverting terminal of each of the charge amplifiers when the sensing operation is operating on the first plurality of sensing cells.

In an exemplary embodiment of the disclosure, the image sensing apparatus further includes a second electrode structure. The second electrode structure is disposed on the substrate, is adjacent to a second side of the sensor array and extends along the second side of the sensor array. Wherein, the second electrode structure is configured to receive a second compensation signal when the sensing operation is operating on a second plurality of sensing cells among the sensing cells of the sensor array.

In an exemplary embodiment of the disclosure, wherein the first electrode structure and the second electrode structure are physically isolated.

In an exemplary embodiment of the disclosure, the image sensing apparatus further includes a second electrode structure. The second electrode structure is disposed on the substrate, is adjacent to the first electrode structure and extends along the first side of the sensor array.

In an exemplary embodiment of the disclosure, wherein the first electrode structure is disposed between the sensory array and the second electrode structure.

In an exemplary embodiment of the disclosure, wherein the first plurality of sensing cells are relatively closer to the first side of the sensor array than the second plurality of sensing cells.

In an exemplary embodiment of the disclosure, wherein a phase of the first compensation signal is the same as a phase of the second compensation signal.

In an exemplary embodiment of the disclosure, wherein the first electrode structure is a shielding structure.

In an exemplary embodiment of the disclosure, wherein the first electrode structure is disposed between the sensor array and a seal ring structure of the image sensing structure.

In summary, the present disclosure provides the first electrode structure adjacent to a first side of the sensor array and extending along the first side of the sensor array. By applying the first compensation signal to the first electrode structure when the sensing operation is operating, an effect of parasitic capacitor on the first side of the sensor array can be reduced, and a quality of the sensing image can be improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiment may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 3:
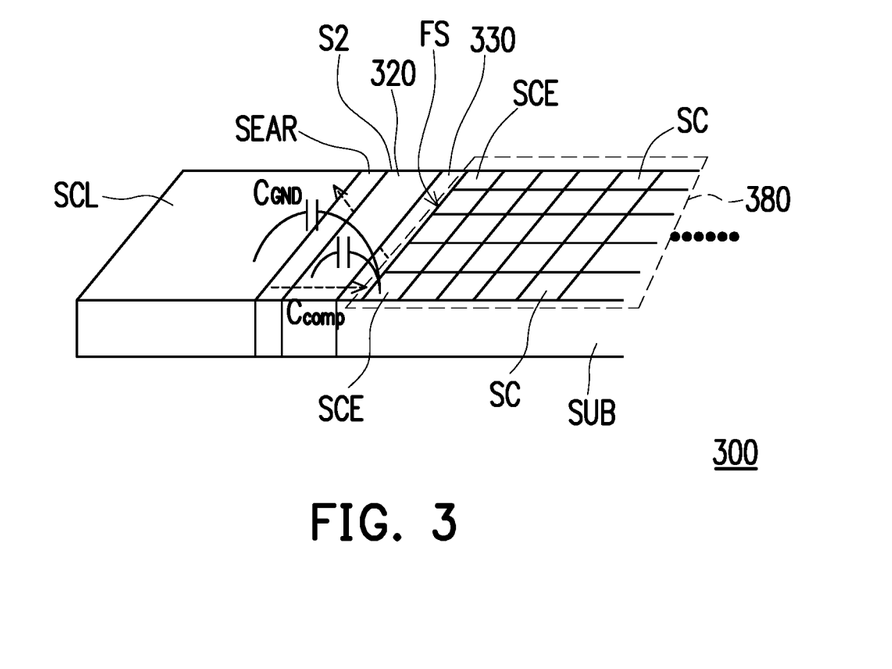
FIG. 3 illustrates a schematic diagram of an image sensing apparatus according to an embodiment of present disclosure.

Please refer to FIG. 3, which illustrates a schematic diagram of an image sensing apparatus according to an embodiment of present disclosure. The image sensing apparatus 300 includes a substrate SUB, a plurality of sensing cells SCE and SC and an electrode structure 320. The sensing cells SCE and SC are disposed on the substrate SUB, and forms a sensor array 310, where sensing cells SCE are relatively closer to the first side FS of the sensor array 310 than the sensing cells SC. The electrode structure 320 is disposed on the substrate SUB and adjacent to a first side FS of the sensor array 310. Further, the electrode structure 320 extends along the first side FS of the sensor array 310. There is an insulating structure 330 disposed between the first side FS of the sensor array 310 and the electrode structure 320. On the other side of the electrode structure 320, a seal ring SEAR and a scribe line SCL are disposed on the substrate SUB in sequence. That is, the seal ring SEAR is disposed between the scribe line SCL and the electrode structure 320, the electrode structure 320 is disposed between the seal ring SEAR and the insulating structure 330.

Based on the structure of FIG. 3, there is a parasitic capacitor $C_{GND}$ formed between the scribe line SCL and the sensor array 310 and a parasitic capacitor $C_{COMP}$ formed between the electrode structure 320 and the sensing cells SCE (which are closed to the first edge FS) of the sensor array 310.

Figure 4:
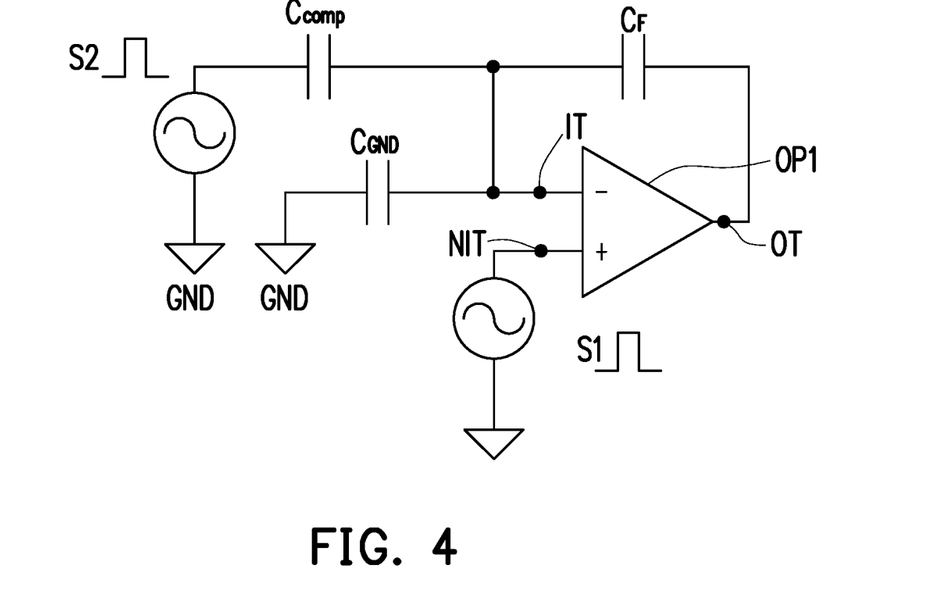
FIG. 4 illustrates an effective circuit diagram corresponding to each of the sensing cells SCE of the image sensing apparatus 300.

About a sensing operation of the image sensing apparatus 300, please refer to FIG. 3 and FIG. 4, where FIG. 4 illustrates an effective circuit diagram corresponding to each of the sensing cells SCE of the image sensing apparatus 300. When a sensing operation is operating on the sensing cells closed to the first edge FS of the sensor array 310, a compensation signal S2 is applied to the electrode structure 320. For the sensing operation, in FIG. 4, the image sensing apparatus 300 includes a charge amplifier OP1. The charge amplifier OP1 has an inverting terminal IT, a non-inverting terminal NIT and an output terminal OT. The non-inverting terminal NIT of the charge amplifier OP1 receives a driving signal S1. A capacitor CF is coupled between the output terminal OT and the inverting terminal IT of the charge amplifier OP1, where the capacitor CF is a feedback capacitor of the charge amplifier OP1 corresponding to the sensing cell SCE. The parasitic capacitor $C_{GND}$ is formed between the inverting terminal IT and a reference ground GND. The parasitic capacitor $C_{COMP}$ is formed between the inverting terminal IT of the charge amplifier OP1 and the compensation signal S2, on the other hand, a first terminal of the parasitic capacitor $C_{COMP}$ is coupled to the inverting terminal IT of the charge amplifier OP1, and a second terminal of the parasitic capacitor $C_{COMP}$ receives the compensation signal S2. In this embodiment, the parasitic capacitor $C_{COMP}$ is used to be a compensation capacitor, and used to cancel the parasitic capacitor $C_{GND}$ between the sensing cell SCE and the reference ground GND. When the sensing operation of the sensing cells SCE is operating, although the sensing cells SCE may loss charges through the parasitic capacitor $C_{GND}$, but also the parasitic capacitor $C_{COMP}$ can be used to be a path for injecting compensation charges back to the sensing cells SCE. It can be seen, the effect of the parasitic capacitor $C_{GND}$ can be reduced, and the quality of the sensing image can be improved.

Figure 5:
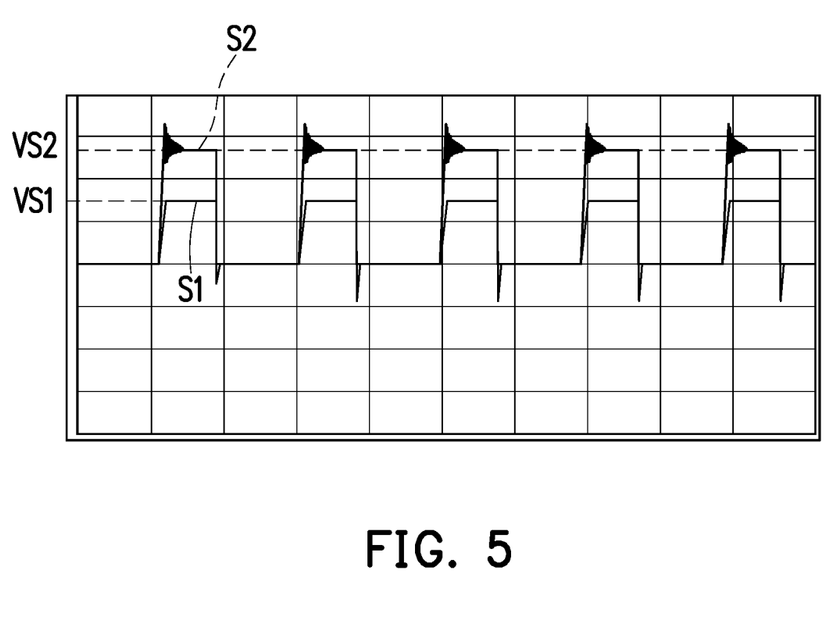
FIG. 5 illustrates waveform plot of driving signal and compensation signal according to an embodiment of present disclosure.

Please refer to FIG. 5, which illustrates waveform plot of driving signal and compensation signal according to an embodiment of present disclosure. In this embodiment, the driving signal S1 and the compensation signal S2 are pulse signals, and may have same phase. An enable voltage level VS1 of the driving signal S1 and an enable voltage level VS2 of the compensation signal S2 can be determined according to the parasitic capacitor $C_{GND}$ and the parasitic capacitor $C_{COMP}$. In detail, the enable voltage levels VS1 and VS2 can be determined according to an equation 1 shown as below:

$$C_{COMP} \times VS2 = C_{GND} \times VS1 \qquad \text{Equation 1.}$$

In this embodiment, the enable voltage level VS1 of the driving signal S1 is lower than the enable voltage level VS2 of the compensation signal S2. In another embodiment, the enable voltage level VS1 of the driving signal S1 may be higher than or equal to the enable voltage level VS2 of the compensation signal S2.

On the other hand, the enable voltage level VS2 can be determined after a hardware of the image sensing apparatus 300 have been made.

Figure 6:
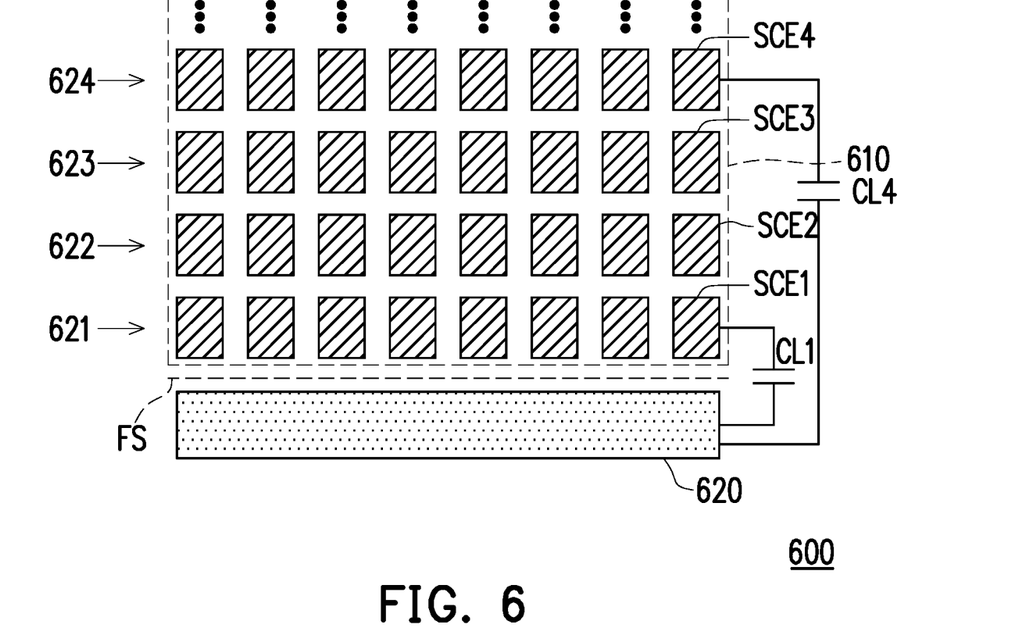
FIG. 6 illustrates a schematic diagram of an image sensing apparatus according to another embodiment of present disclosure.

Please refer to FIG. 6, which illustrates a schematic diagram of an image sensing apparatus according to another embodiment of present disclosure. The image sensing apparatus 600 includes a sensor array 610 and an electrode structure 620. The sensor array 610 and the electrode structure 620 are disposed on a substrate. The sensor array 610 is composed of a plurality of sensing cells SCE1~SCE4, and the sensing cells SCE1~SCE4 are respectively arranged into a plurality of sensor lines 621~624. The electrode structure 620 is adjacent to a first side FS of the sensor array 610, and extending along the first side FS of the sensor array 610. In FIG. 6, the sensing cells SCE1~SCE4 are part of sensing cells in the sensor array 610, and the sensing cells SCE1~SCE4 are arranged close to the first side FS of the sensor array 610.

It should be noted here, there are a plurality of different distances between the sensor lines 621~624 and the electrode structure 620. That is, parasitic capacitors between each of the sensor lines 621~624 and the electrode structure 620 are different. Take the sensing cells SCE1 and SCE4 for an example, a parasitic capacitor $C_{L1}$ formed between the sensing cells SCE1 and the electrode structure 620 is larger than a parasitic capacitor $C_{L4}$ formed between the sensing cells SCE4 and the electrode structure 620.

In this embodiment, by applying a compensation signal to the electrode structure 620 when a sensing operation is operated by the sensing units, both of the parasitic capacitors Cu and $C_{L4}$ can be used to be paths for injecting compensation charges back to the sensing cells SCE1 and SCE4 with different compensation charges amounts, and a quality of the sensing image can be improved.

Figure 7:
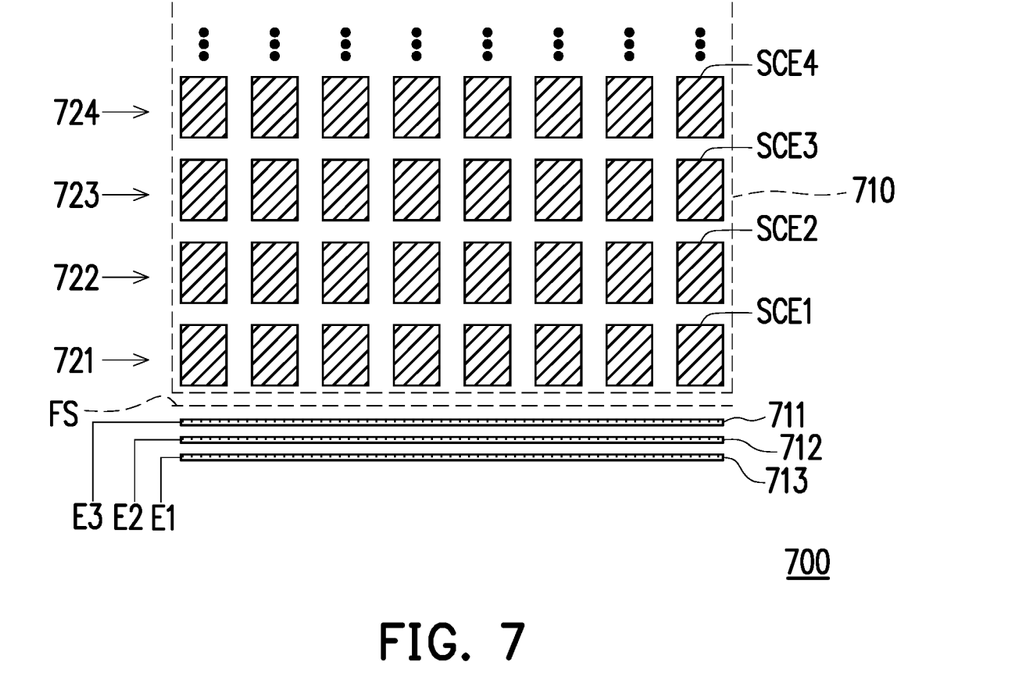
FIG. 7 illustrates a schematic diagram of an image sensing apparatus according to another embodiment of present disclosure.

Please refer to FIG. 7, which illustrates a schematic diagram of an image sensing apparatus according to another embodiment of present disclosure. The image sensing apparatus 700 includes a sensor array 710 and a plurality of electrode structures 711~713. In FIG. 7, the sensor array 710 is composed of a plurality of sensing cells SCE1~SCE4, and the sensing cells SCE1~SCE4 are respectively arranged into a plurality sensor lines 721~724. Furthermore, the electrode structures 711~713 are arranged adjacent to a first side FS of the sensor array 710 in sequence, and the electrode structures 711~713 extend along the first side FS of the sensor array 710. In FIG. 7, the sensing cells SCE1~SCE4 are part of sensing cells in the sensor array 710, and the sensing cells SCE1~SCE4 are arranged close to the first side FS of the sensor array 710. Besides, the electrode structures 711~713 may be arranged in parallel When a sensing operation is operated by the sensing units, a compensation signal may be applied to at least one of the electrode structures 711~713. For example, if the sensing operation is operated on the sensor line 724, the compensation signal may be applied to all of the electrode structures 711~713; if the sensing operation is operated on the sensor line 723, the compensation signal may be applied to the electrode structures 711712 and the compensation signal may be not applied to the electrode structure 713 (i.e. the electrode structure 713 may be floated); if the sensing operation is operated on the sensor line 722, the compensation signal may be applied to the electrode structures 711 and 713 and the compensation signal may be not applied to the electrode structure 712 (i.e. the electrode structure 712 may be floated); and, if the sensing operation is operated on the sensor line 721, the compensation signal may be applied to the electrode structure 711 and the compensation signal may be not applied to the electrode structures 712 and 713 (i.e. the electrode structure 712 and 713 may be floated).

In some embodiment, the electrode structures 711~713 may respectively receive a plurality of compensation signals E3~E1. All of the compensation signals E3~E1 may have same phases. Enable voltage levels of the compensation signals E3~E1 may be the same, or may be different. By the compensating scheme mentioned above, compensation capacitances between the sensor lines 721~724 may be almost the same.

It should be noted here, number of the electrode structures 711~713 in FIG. 7 is only an example. In some example, number of the electrode structures can be decided by designer, and no special limitation here.

Figure 8:
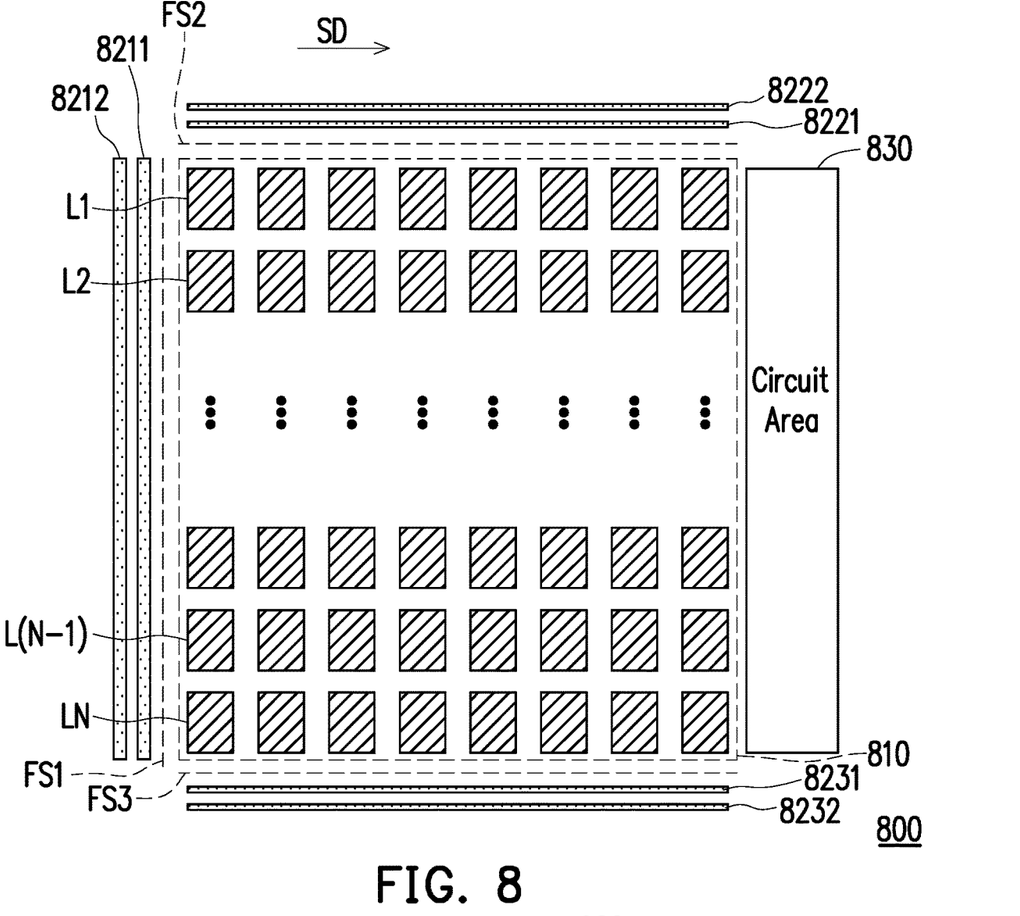
FIG. 8 illustrates a schematic diagram of an image sensing apparatus according to another embodiment of present disclosure.

Please refer to FIG. 8, which illustrates a schematic diagram of an image sensing apparatus according to another embodiment of present disclosure. The image sensing apparatus 800 includes a sensor array 810, a plurality of first electrode structures 8211~8212, a plurality of second electrode structures 8221~8222, a plurality of third electrode structures 8231~8232 and a circuit area 830. Take two electrode structures for an example in FIG. 8, but number of the electrode structures is not limited thereto. The sensor array 810 includes a plurality of sensing cells, and the sensing cells forms a plurality of sensor lines L1~LN. The first electrode structures 8211 and 8212 are disposed adjacent to a first side FS1 of the sensor array 810, the second electrode structures 8221 and 8222 are disposed adjacent to a second side FS2 of the sensor array 810, and the third electrode structures 8231 and 8232 are disposed adjacent to a third side FS3 of the sensor array 810. The first electrode structures 8211 and 8212, the second electrode structures 8221 and 8222 and the third electrode structures 8231 and 8232 respectively extend along the first side FS1, the second side FS2 and the third side FS3. The second electrode structures 8221 and 8222 are isolated from the first electrode structures 8211 and 8212, the first electrode structures 8211 and 8212 are isolated form the third electrode structures 8231 and 8232, and the second electrode structures 8221 and 8222 are isolated from the third electrode structures 8231 and 8232.

When a sensing operation is operated, the sensor lines L1~LN are scanned in sequence according to a scanning direction SD. If the sensing operation is operated on the sensor line L1 or the sensor line L2, one or more compensation signal may be applied to at least one of the corresponding second electrode structures 8221 and 8222 for a compensation operation. If the sensing operation is operated on the sensor line L(N−1) or the sensor line LN, one or more compensation signal may be applied to at least one of the corresponding third electrode structures 8231 and 8232 for the compensation operation. Further, during a sensing operation period operated by the sensor array 810, one or more compensation signal may be applied to at least one of the corresponding first electrode structures 8211 and 8212 adjacent to the third side FS3 of the sensor array 810 for a compensation operation. When sensing units of the sensor array 810 far from the first side FS1, the second side FS2 and the third side FS3 are activated for the sensing operation, the compensation signal may not be applied to the first electrode structures 8211 and 8212, the second electrode structures 8221 and 8222, and the third electrode structures 8231 and 8232 (i.e. be floated).

In this embodiment, the circuit area 830 is coupled to the sensor array 810. The circuit area 830 includes a plurality of charge amplifiers, and each of the charge amplifiers can be seen in FIG. 4. The charge amplifiers are configured to generate the sensing image according to a driving signal and a compensation signal when the sensing operation is operated, where the sensing image may be a fingerprint image.

Number of the electrode structures disposed on each side of the sensor array is not limited in embodiments of presented invention. A designer can adjust the number of the electrode structures on each side of the sensor array according to the parasitic capacitor on the sensing units of corresponding side.

Figure 9:
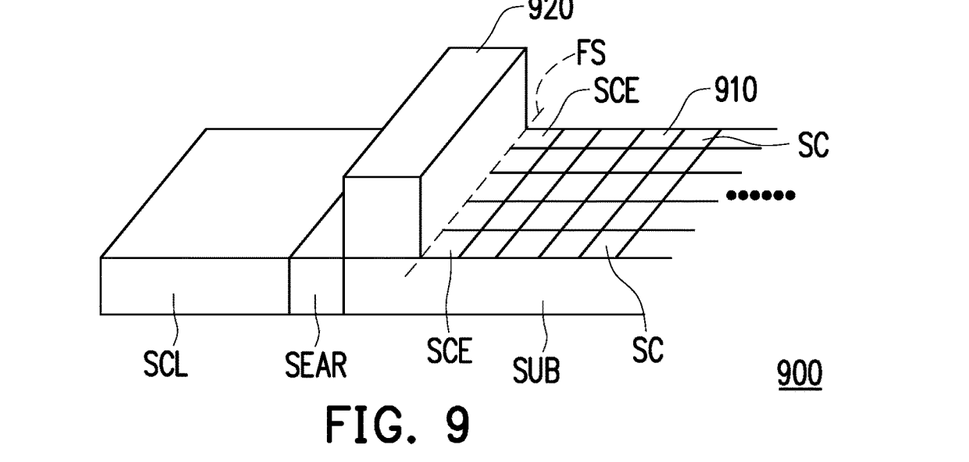
FIG. 9 illustrates a schematic diagram of an image sensing apparatus according to another embodiment of present disclosure.

Please refer to FIG. 9, which illustrates a schematic diagram of an image sensing apparatus according to another embodiment of present disclosure. The image sensing apparatus 900 includes a substrate SUB, a sensor array 910, an electrode structure 920, a seal ring SEAR and a scribe line SCL. The sensor array 910 is disposed on the substrate SUB, and the sensor array 910 includes a plurality of sensing cells SCE and SC, where the sensing cells SCE are relatively closer to the first side FS of the sensor array 910 than the sensing cells SC.

In this embodiment, the electrode structure 920 may be a shielding structure and disposed on the substrate SUB and between the seal ring SEAR and the sensor array 910. The shielding structure may be a gold bump structure or any other conductive structure, and can be constructed into a shielding wall with a pre-set height. The seal ring SEAR is disposed on the substrate SUB, and between the scribe line SCL and the electrode structure 920.

If a sensing operation is operated on the image sensing apparatus 900, a compensation signal can be applied to the electrode structure 920. A phase of the compensation signal is as same as a phase of a driving signal of the sensing operation. When the compensation signal is applied to the electrode structure 920, the electrode structure 920 is configured to cut off a power line on the parasitic capacitances formed between the sensing cells SCE and the scribe line SCL, so as to eliminate the parasitic capacitor between the sensing cells SCE and a reference ground. In some embodiment, a height of the electrode structure 920 may be not higher than 10 micro meters.

Figure 10:
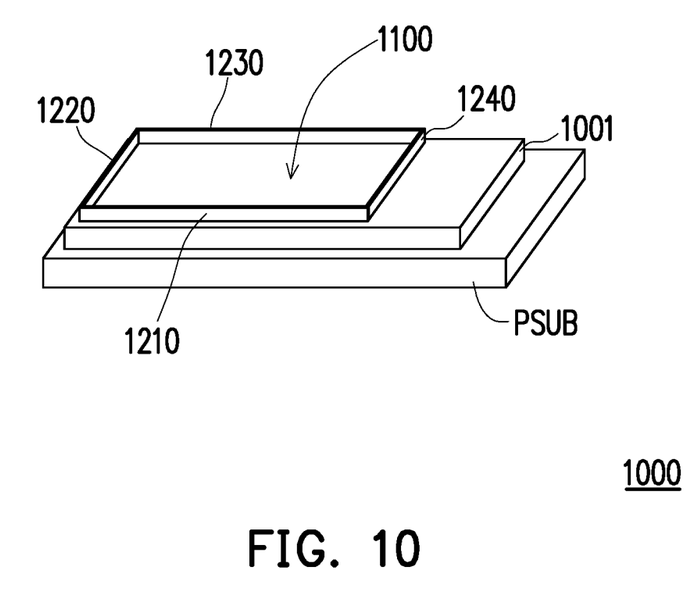
FIG. 10 illustrates a schematic diagram of an image sensing apparatus according to another embodiment of present disclosure.

Please refer to FIG. 10, which illustrates a schematic diagram of an image sensing apparatus according to another embodiment of present disclosure. The image sensing apparatus 1000 includes a package substrate PSUB, an integrated circuit 1001, a sensor array 1100 and a plurality of electrode structures 1210~1240. The integrated circuit 1001 is disposed on the package substrate PSUB. The sensor array 1100 is disposed on the integrated circuit 1001, and the electrode structures 1210~1240 are disposed on the integrated circuit 1001. The electrode structures 1210~4240 form a closed shielding wall for surrounding the sensor array 1100. One or more compensation signals can be applied to at least one of the electrode structures 1210~4240 when a sensing operation is operated. Such as that, effect by parasitic capacitances to a reference ground can be eliminated according to a compensation scheme.

About details of the compensation scheme has been described in the embodiments mentioned above, and no more repeated description here.

In this embodiment, the electrode structures 1210~1240 contact to each other and form the closed shielding wall. In another embodiment, the electrode structures 1210~1240 can be isolated to each other, and not necessary to form the closed shielding wall.

In summary, embodiments of present disclosure provide electrode structure disposed adjacent to sensing cells. By applying compensation signal to the electrode structure when the sensing operation is operated, effect of parasitic capacitor between the sensing cells and a reference ground can be eliminated, so as to improve the quality of the sensing image.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An image sensing apparatus, comprising:
    a substrate;
    a sensor array, having a plurality of sensing cells, being disposed on the substrate, and being configured to receive a driving signal;
    a first electrode structure, disposed on the substrate, separated from the sensor array and being adjacent to a first side of the sensor array and extending along the first side of the sensor array; and
    an insulating structure, disposed outside the sensor array and between the sensor array and the first electrode structure,
    wherein, the first electrode structure is separated from the first side of the sensor array by the insulating structure and the first electrode structure is configured to receive a first compensation signal when a sensing operation is operating on a first plurality of sensing cells among the sensing cells of the sensor array, wherein the first compensation signal is different from the driving signal and has a same phase as that of the driving signal.

2. The image sensing apparatus according to claim 1, wherein the first electrode structure is disposed between the insulating structure and a seal ring structure of the image sensing apparatus.

3. The image sensing apparatus according to claim 1, wherein the first plurality of sensing cells are disposed close to the first side of the sensor array.

4. The image sensing apparatus according to claim 1, further comprising a plurality of charge amplifiers respectively coupled to the sensing cells of the sensor array.

5. The image sensing apparatus according to claim 4, wherein the phase of the first compensation signal is same as the phase of the driving signal coupled to a non-inverting terminal of each of the charge amplifiers when the sensing operation is operating on the first plurality of sensing cells.

6. The image sensing apparatus according to claim 1, further comprising:
    a second electrode structure, disposed on the substrate, being adjacent to a second side of the sensor array and extending along the second side of the sensor array,
    wherein, the second electrode structure is configured to receive a second compensation signal when the sensing operation is operating on a second plurality of sensing cells among the sensing cells of the sensor array.

7. The image sensing apparatus according to claim 6, wherein the first electrode structure and the second electrode structure are physically isolated.

8. The image sensing apparatus according to claim 1, further comprising:
    a second electrode structure, disposed on the substrate, being adjacent to the first electrode structure and extending along the first side of the sensor array,
    wherein, the second electrode structure is configured to receive a second compensation signal when the sensing operation is operating on a second plurality of sensing cells among the sensing cells of the sensor array.

9. The image sensing apparatus according to claim 8, wherein the first electrode structure is disposed between the sensory array and the second electrode structure.

10. The image sensing apparatus according to claim 8, wherein the first plurality of sensing cells are relatively closer to the first side of the sensor array than the second plurality of sensing cells.

11. The image sensing apparatus according to claim 8, wherein a phase of the first compensation signal is same as a phase of the second compensation signal.

12. An image sensing apparatus, comprising:
    a substrate;
    a sensor array, having a plurality of sensing cells, being disposed on the substrate, and being configured to receive a driving signal; and
    a first electrode structure, disposed on the substrate, being adjacent to a first side of the sensor array and extending along the first side of the sensor array,
    wherein, the first electrode structure is configured to receive a first compensation signal when a sensing operation is operating on a first plurality of sensing cells among the sensing cells of the sensor array, wherein the first electrode structure is a shielding structure, the shielding structure is protruding from the substrate, and the first electrode structure is disposed between the sensor array and a seal ring structure of the image sensing structure, wherein the first compensation signal is different from the driving signal and has a same phase as that of the driving signal.

* * * * *